(12) United States Patent
Wilson

(10) Patent No.: US 7,049,866 B2
(45) Date of Patent: May 23, 2006

(54) COMPENSATING FOR LEAKAGE CURRENTS IN LOOP FILTER CAPACITORS IN PLLS AND THE LIKE

(75) Inventor: William B. Wilson, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 1 day.

(21) Appl. No.: 10/808,864

(22) Filed: Mar. 24, 2004

(65) Prior Publication Data
US 2005/0212566 A1   Sep. 29, 2005

(51) Int. Cl.
*H03D 3/24* (2006.01)
(52) U.S. Cl. ............... 327/157; 327/558; 375/376; 375/327
(58) Field of Classification Search ............ 327/558, 327/156–159, 147–148, 552; 375/327, 376
See application file for complete search history.

(56) References Cited

U.S. PATENT DOCUMENTS

| | | | | |
|---|---|---|---|---|
| 5,659,588 | A | * | 8/1997 | Fiedler ................. 375/376 |
| 5,942,949 | A | | 8/1999 | Wilson et al. ............. 331/17 |
| 6,016,332 | A | * | 1/2000 | Smith et al. ............. 375/376 |
| 6,043,715 | A | | 3/2000 | Bailey et al. ............. 331/2 |
| 6,510,033 | B1 | * | 1/2003 | Maloney et al. ........... 361/111 |
| 6,600,351 | B1 | * | 7/2003 | Bisanti et al. ........... 327/157 |
| 6,826,246 | B1 | | 11/2004 | Brown et al. ............. 375/376 |
| 6,861,898 | B1 | * | 3/2005 | Hsu et al. ............... 327/552 |
| 2005/0035797 | A1 | * | 2/2005 | Frans et al. ............. 327/156 |

OTHER PUBLICATIONS

"A CMOS Selft-Calibrating Frequency Synthesizer", by William Wilson et al., IEEE Journal of Solid-State Circuits, vol. 35, No. 10, Oct. 2000, pp. 1437-1444.

* cited by examiner

Primary Examiner—Dinh T. Le

(57) ABSTRACT

Circuitry compensates for adverse effects resulting from leakage currents in loop filter capacitors for signal synthesizers, like PLLs. In one technique, leakage current in the loop filter's damping capacitor is compensated by driving the voltage across a matching capacitor and generating current for the damping capacitor based on current applied to the matching capacitor. In another technique, leakage current in the loop filter's transconductor capacitor is compensated by digitally accumulating differences between the damping capacitor voltage and a reference voltage, and then converting the accumulated difference into a (voltage or current) signal applied to the transconductor capacitor. In addition, the loop filter could have an analog transconductor path that generates a signal that is also applied to the transconductance capacitor. By effectively compensating for capacitor leakage currents, signal synthesizers of the present invention can be implemented using capacitors having thinner oxide gates, thereby reducing the size of the capacitors.

32 Claims, 5 Drawing Sheets

COMPENSATING FOR LEAKAGE CURRENTS IN LOOP FILTER CAPACITORS IN PLLS AND THE LIKE

BACKGROUND OF THE INVENTION

1. Field of the Invention

The present invention relates to electronics, and, in particular, to charge-pump phase-locked loops and other signal synthesizers having loop filters with capacitors.

2. Description of the Related Art

A phase-locked loop (PLL) is a circuit that generates a periodic output signal that has a constant phase relationship with respect to a periodic input signal. PLLs are widely used in many types of measurement, microprocessor, and communication applications. One type of phase-locked loop is the charge-pump PLL, which is described in Floyd M. Gardner, "Charge-Pump Phase-Lock Loops," *IEEE Trans. Commun.*, vol. COM-28, pp. 1849–1858, November 1980, the teachings of which are incorporated herein by reference.

FIG. 1 shows a block diagram of a conventional charge-pump phase-locked loop 100. Phase detector (PD) 102 compares the phase $\theta_{IN}$ of an input signal to the phase $\theta_{FB}$ of a feedback signal and generates an error signal: either an UP signal U (when $\theta_{IN}$ leads $\theta_{FB}$) or a DOWN signal D (when $\theta_{FB}$ leads $\theta_{IN}$), where the width of the error signal pulse indicates the magnitude of the difference between $\theta_{IN}$ and $\theta_{FB}$.

Charge pump 104 generates an amount of charge q equivalent to the error signal (either U or D) from PD 102. Depending on whether the error signal was an UP signal or a DOWN signal, the charge q is either added to or subtracted from one or more capacitors in loop filter 106. In a typical implementation, loop filter 106 operates as an integrator that accumulates the net charge from charge pump 104. As shown in FIG. 1, loop filter 106 generates two inputs for voltage-controlled oscillator (VCO) 108: a low-gain input $V_{CTRL}$ and a high-gain input $V_{BG}$. A voltage-controlled oscillator is a device that generates a periodic output signal ($F_{OUT}$ in FIG. 1), whose frequency is a function of the VCO input voltages $V_{CTRL}$ and $V_{BG}$, where the high-gain input voltage $V_{BG}$ is used to set the center frequency during calibration and the low-gain input voltage $V_{CTRL}$ serves as the steady-state signal path. In addition to being the output signal from PLL 100, the VCO output signal $F_{OUT}$ is used to generate the feedback signal for PD 102.

Optional input and feedback dividers 110 and 112 may be are placed in the input and feedback paths, respectively, if the frequency of the output signal $F_{OUT}$ is to be either a fraction or a multiple of the frequency of the input signal $F_{IN}$.

More information about PLLs like PLL 100 can be found in U.S. Pat. No. 5,942,949, the teachings of which are incorporated herein by reference.

As described previously, although not shown in FIG. 1, the loop filters of conventional charge-pump PLLs, such as PLL 100, are implemented using capacitors. In order for such PLLs to operate properly it is important to avoid the adverse affects of gate oxide leakage currents in those loop-filter capacitors. The conventional approach to avoid the adverse affects of such leakage currents is to use capacitors in the loop filter that have relative large oxide thicknesses (e.g., 50–70 Angstroms). Unfortunately, such capacitors require relatively large areas to implement. It would be desirable to implement loop filters in charge-pump PLLs using capacitors having relatively small oxide thicknesses (e.g., 17 Angstroms) and correspondingly relatively small implementation areas.

SUMMARY OF THE INVENTION

Problems in the prior art are addressed in accordance with the principles of the present invention by a loop filter architecture for charge-pump PLLs that reduces the adverse effects of gate oxide leakage currents in the capacitors used in the loop filter without requiring the use of relatively large capacitors having relatively large oxide thicknesses.

According to one embodiment of the present invention, a signal synthesizer (e.g., a PLL) comprises a loop filter connected between a charge pump and an oscillator of the signal synthesizer to accumulate charge from the charge pump and generate at least a first control signal for the oscillator.

According to one technique for operating the signal synthesizer, the loop filter comprises a damping capacitor connected to a resistor, a matching capacitor, and sensing-and-canceling circuitry adapted to (1) drive a voltage across the matching capacitor to match a first reference voltage and (2) generate, based on a first current associated with driving the voltage across the matching capacitor, a second current applied to the damping capacitor to compensate for leakage current in the damping capacitor.

According to another technique for operating the signal synthesizer, the loop filter comprises a resistor, a damping capacitor connected at a first node to the resistor, a transconductor capacitor connected to generate the first control signal for the oscillator, and a digital gm path adapted to (1) digitally accumulate differences between a reference voltage and a voltage at the first node and (2) generate a first gm output signal based on the accumulated differences, wherein the first gm output signal is applied to the transconductor capacitor.

Although not required, the two techniques can be combined in a single implementation.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
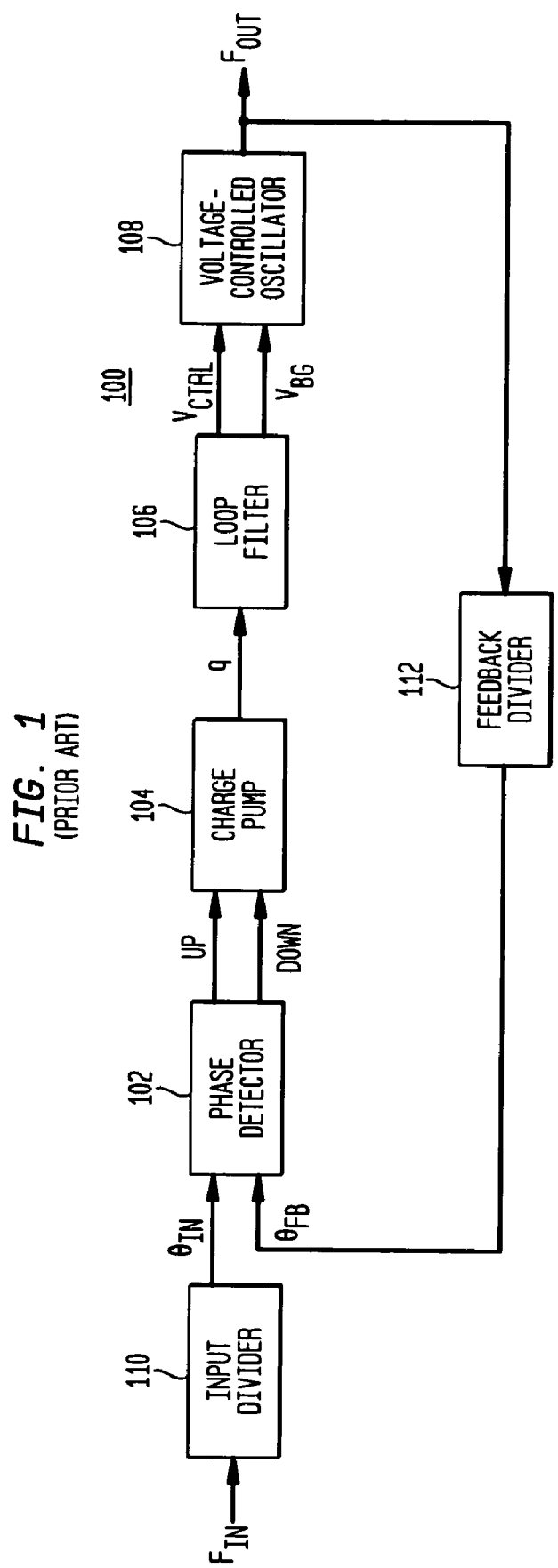
FIG. 1 shows a block diagram of a conventional charge-pump phase-locked loop.
Figure 2:
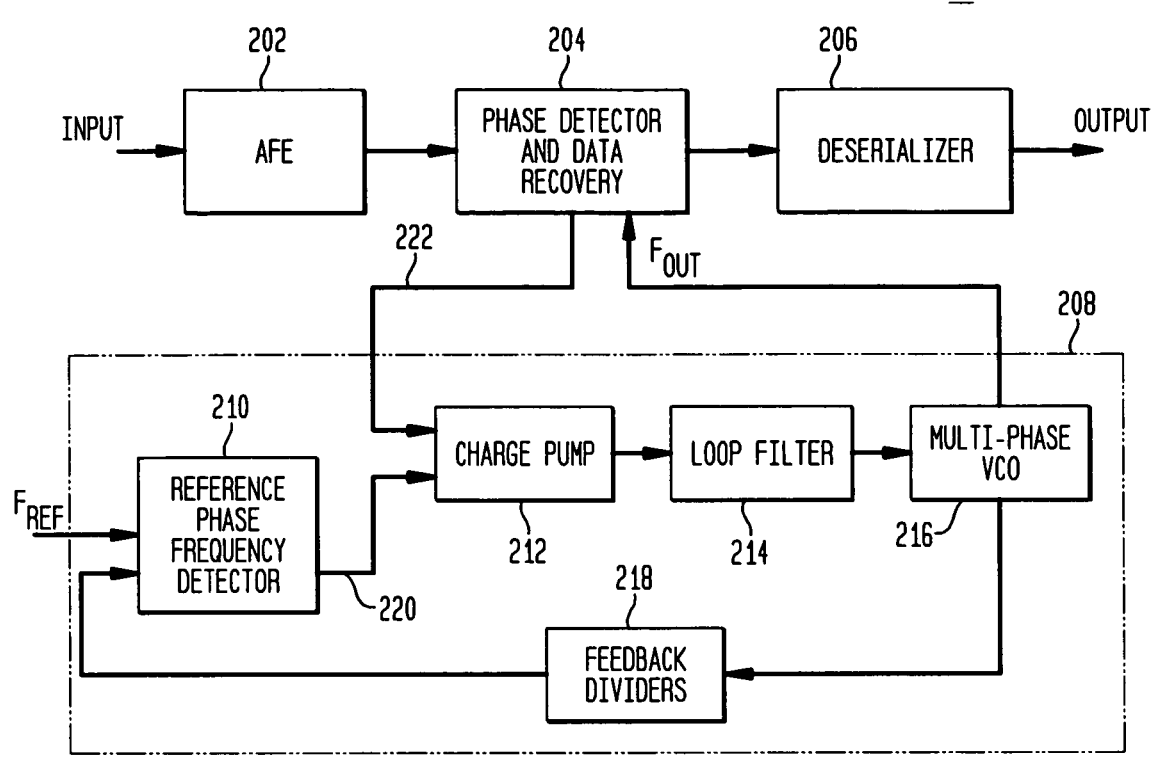
FIG. 2 shows a high-level block diagram of a clock/data recovery (CDR) circuit, according to one embodiment of the present invention.

FIG. 2 shows a high-level block diagram of a clock/data recovery (CDR) circuit 200, according to one embodiment of the present invention. CDR circuit 200 has analog front end (AFE) 202, phase detector/data recovery (PD/DR) circuitry 204, deserializer 206, and charge-pump PLL 208. PLL 208, which includes reference phase/frequency detector 210, charge pump 212, loop filter 214, multi-phase VCO 216, and feedback dividers 218, has the same basic architecture of PLL 100 of FIG. 1. In one implementation, VCO 216 is a four-stage differential ring oscillator generating eight output phases of CMOS logic levels. As such, VCO 216 runs at ¼ of the known data rate, and a feedback divider of 4 or 5 allows for training to a local reference clock at 1/16 or 1/20 of the incoming data rate.

The purpose of CDR circuit 200 is to recover data encoded in a received analog input signal. In particular, AFE 202 provides line termination impedance and adds some gain to the input signal, PD/DR circuitry 204 recovers the data from the input signal based on a multi-phase clock signal $F_{OUT}$ generated by VCO 216 of PLL 208, and deserializer 206 merges the recovered data to generate parallel output data (e.g., 16-bit or 20-bit words) for further processing downstream.

In order for PD/DR circuitry 204 to operate properly, the clock signal $F_{OUT}$ generated by PLL 208 should have an appropriate frequency and be sufficiently synchronized with the data encoded in the input signal. To provide that frequency matching and phase synchronization, charge pump 212 receives UP and DN signals 220 from reference phase/frequency detector (PFD) 210 (when PLL 208 is operated in its "lock to reference" mode) and UP and DN signals 222 from PD/DR circuitry 204 (when PLL 208 is operated in its "lock to data" mode).

At a certain level, CDR circuit 200 could be said to have effectively two different phase-locked loops. One such loop is labeled in FIG. 2 and referred to herein as PLL 208, in which PFD 210 provides the UP/DN signals to charge pump 212. This loop is in phase lock during the "lock to reference" mode. The other loop also includes charge pump 212, loop filter 214, and VCO 216, but instead of relying on PFD 210, this loop relies on PD/DR 204 to generate the UP/DN signals for charge pump 212. This other loop is in phase lock during the "lock to data" mode.

During the "lock to reference" mode, PFD 210 compares the phase of the feedback signal from feedback dividers 218 with the phase of a local reference clock signal $F_{REF}$ to generate UP and DN pulses 220, which are varied in width according to the magnitude of the detected phase error. During this mode, the high-gain input signal $V_{BG}$ is used to set the center frequency of VCO 216.

During the "lock to data" mode, PD/DR circuitry 204 uses an "Alexander" or bang-bang phase detector to compare the phase of the PLL output clock signal $F_{OUT}$ to the phase of the input signal in order to generate phase information (i.e., UP/DOWN pulses 222) that is applied to charge pump 212 of PLL 208. The phase information from PD/DR circuitry 204 is a one-bit quantization of the actual incoming phase error and is used by charge pump 212 to put a fixed amount of charge onto the loop filter for each update. More information on Alexander phase detectors can be found in J. D. H. Alexander, "Clock Recovery from Random Binary Signals," *Electronic Letters*, October 1975, the teachings of which are incorporated herein by reference.

In either "lock to reference" or "lock to data" mode, the polarity of the charge pulse is determined by the polarity of the incoming phase error. The UP/DN pulses from PD/DR circuitry 204 and PFD 210 enable VCO 216 to generate a PLL output clock signal $F_{OUT}$ having an appropriate frequency and phase. In "lock to reference" mode, the output of VCO 216 is phase- and frequency-locked to the reference frequency $F_{REF}$, which is close to but not necessarily equal to an integer scaling of the input data rate. This mode is used during system start-up to get the operating frequency of the VCO sufficiently close to an integer scaling of the data rate. Thus, it is within the pull-range of PD/DR 204, which has no embedded frequency detector, and phase-lock to the data can be obtained when the system is switched from the "lock to reference" mode to the "lock to data" mode.

Figure 3:
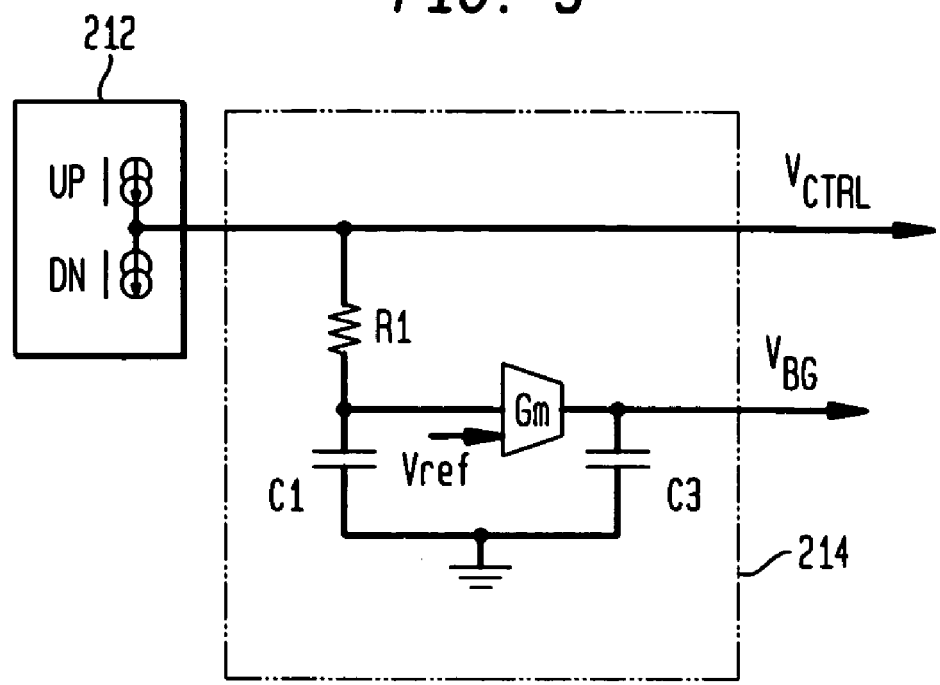
FIG. 3 shows a schematic diagram of the charge pump and the loop filter of the PLL of FIG. 2.

FIG. 3 shows a schematic diagram of charge pump 212 and loop filter 214 of PLL 208 of FIG. 2. Charge pump 212 puts either a positive or a negative current onto loop filter 214 for an amount of time determined from the width of each received UP/DN pulse. The width of the pulse multiplied by the magnitude of the current determines the amount of charge injected into loop filter 214. This packet of charge charges a parasitic capacitor (not shown) and also flows through resistor R1, charging capacitor C1 (also referred to as "the damping capacitor"). The long-term voltage on capacitor C1 is summed with the voltage across resistor R1 to determine the low-gain input voltage $V_{CTRL}$ applied to VCO 216 of FIG. 2.

Transconductor cell Gm generates—and injects onto capacitor C3 (also referred to as the "transconductor capacitor")—a current that is proportional to the difference between the voltage on capacitor C1 and a reference voltage $V_{REF}$. The voltage on capacitor C3 is adjusted, via the negative feedback action of PLL 208 (in which, for example, the PLL feedback loop from VCO 216 to PFD 210 drives the low-gain input voltage $V_{CTRL}$ to lock the loop), until the voltage across capacitor C1 is equal to reference voltage $V_{REF}$. (Note that PD/DR 204 can also generate UP/DN signals for charge pump 212.) Capacitor C3 integrates the current from transconductor cell Gm to set the center frequency of VCO 216 based on the high-gain input voltage $V_{BG}$. While $V_{BG}$ settles to a final value, $V_{CTRL}$ is continuously updated to maintain phase lock.

Gate Leakage Current at the Damping Capacitor

If significant gate leakage currents are associated with the damping capacitor C1, then the performance of CDR circuit 200 of FIG. 2 will typically be degraded in two ways. The first is the movement of one integrator off of the origin, where the resulting frequency of the pole can possibly be so large as to affect loop stability. This occurs because the presence of gate leakage is equivalent to placing a resistor in parallel with capacitor C1. If this parasitic resistor $R_{PARA}$ is not several orders of magnitude larger than resistor R1, then the frequency of the pole can be quite large. If the pole frequency is large relative to the closed-loop −3 dB frequency of either the PLL employing PFD 206 (i.e., PLL 208) or the PLL employing PD/DR 204 (i.e., the "other loop" of FIG. 2), then a loss of phase margin can occur.

Figure 4:
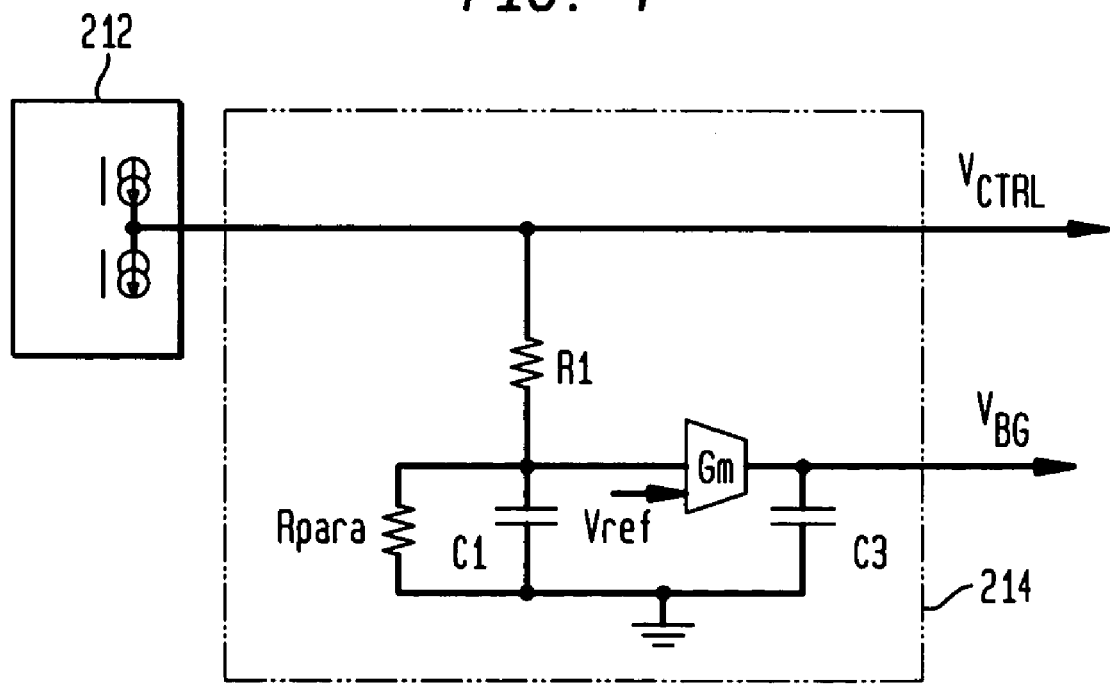
FIG. 4 shows a schematic diagram of the charge pump and the loop filter of the PLL of FIG. 2, in which the effect of gate leakage current in capacitor C1 is represented by parasitic resistor $R_{PARA}$.

FIG. 4 shows a schematic diagram of charge pump 212 and loop filter 214 of PLL 208 of FIG. 2, in which the effect of gate leakage current in capacitor C1 is represented by parasitic resistor $R_{PARA}$.

The input impedance Z(s) as seen by the charge pump is given by Equation (1) as follows:

$$Z(s) = \frac{(R_{PARA} + R_1) + sR_{PARA}R_1C_1}{s(R_{PARA} + R_1)C_2 + s^2R_{PARA}R_1C_1C_2 + 1 + sR_{PARA}C_1}, \quad (1)$$

where $C_2$ (not shown in FIG. 4) is the parasitic capacitance of node $V_{CTRL}$. In the limit, as the parasitic resistance $R_{PARA}$ goes to infinity, the impedance $Z(s)$ may be represented by Equation (2) as follows:

$$Z(s) = \frac{(R_1 + 1/sC_1)}{sC_2(R_1 + 1/sC_2)}, \quad (2)$$

where the magnitude of $C_1$ is preferably much greater than (e.g., at least 100 times) the magnitude of $C_2$, in order to keep the loop stable.

In a typical implementation, parasitic resistor $R_{PARA}$ will have a minimum value of about 100 Kohms, while resistor R1 will have a maximum value of about 12 Kohms. Since the parasitic resistor is (at the very least) almost an order of magnitude larger than resistor R1, the movement of the integrator off of the origin is expected to be small. As such, the change in phase margin resulting from gate leakage currents should be negligible and the parasitic (i.e., gate leakage) resistor should have minimal impact on loop stability, in either the "lock to reference" mode or the "lock to data" mode. It should be noted that the charge-pump output resistance (not shown) has a similar effect and, in most designs, also has a negligible effect on stability.

The second way in which the performance of CDR circuit 200 may be degraded in the presence of gate leakage currents on the loop-filter damping capacitor C1 is by the creation of static phase offset. The dc leakage current through capacitor C1 needs to be supplied by charge pump 212. This can only be done by having a net difference between the UP and DN signals, as averaged over time. This difference results in static phase offset. This undesirable phase offset is created by the PLL's negative feedback and will typically increase the bit error rate (BER) of the data recovery process because the PD/DR circuitry 204 will no longer be sampling the data at the center of the data "eye." For example, a capacitor C1 having a parasitic resistance $R_{PARA}$ of about 100 Kohms will have a leakage current of about 5 microamps with a nominal 0.5 volts across it, which will produce a significant static phase offset for a nominal charge-pump current of 20 microamps and will typically result in bit errors. A 17-Angstrom capacitor, which has a leakage current of about 1.6 microamps, will produce a smaller static phase offset, which can also result in bit errors, if the data rate is high enough. One skilled in the art will recognize that the direct relation between the magnitude of the leakage current and the resulting static phase offset is a complicated function of the exact PD used, the amount of incoming phase jitter and inter-symbol interference on the data stream, as well as the loop dynamics and the amount of random noise generated in the various components.

Thus, while gate leakage currents in the loop-filter damping capacitor C1 do not appear to affect stability, they can introduce enough static phase offset to prevent desired levels of CDR performance.

Gate Leakage Current at the Transconductor Capacitor

As described previously, transconductor cell Gm of FIG. 3 has its current integrated onto a capacitor C3 in order to effectively set the center frequency of the oscillator. If transconductor capacitor C3 suffers from gate leakage, then the effective output resistance of transconductor cell Gm is lowered, reducing the dc gain of the integrator. In order to supply the current to this parasitic resistance and maintain the desired output voltage, a non-zero input could be applied to transconductor cell Gm.

Prior to accounting for gate leakage, the output resistance of transconductor cell Gm is about 5 to 10 Mohms. Reducing it to, for example, 500 Kohms would involve an order of magnitude reduction. Further, the gain of transconductor cell Gm is typically about 2.2 microamps per volt, which means that a 0.5v input would be required to generate a 1-microamp output and thus an output voltage of 0.5v (assuming a 500-Kohm parasitic resistor). In this case, there is no linear range left (Vdd=1.0v), and transconductor cell Gm will have gone non-linear. Additionally, the maximum dc bias current in the output of transconductor cell Gm is 500 nanoamps, which is thus the maximum current that can be driven out to support a voltage across the parasitic resistor, and is half of what would otherwise be needed. Clearly, the circuit will not function properly with this amount of gate leakage.

Sensing and Canceling Gate Leakage Current at the Damping Capacitor

Figure 5:
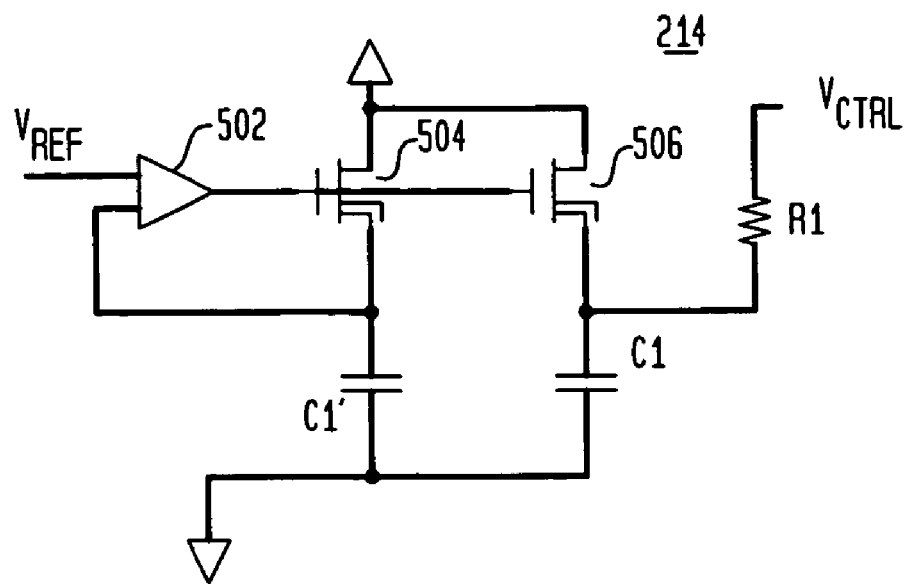
FIG. 5 shows a schematic diagram of the charge pump and the loop filter of FIG. 2, according to one embodiment of the present invention.

FIG. 5 shows a schematic diagram of charge pump 212 and loop filter 214 of FIG. 2, according to one embodiment of the present invention. In this embodiment, op amp 502 generates—and applies to the gates of transistors 504 and 506—a signal that is a function of the difference between the transconductor reference voltage $V_{REF}$ and the voltage across a matching capacitor C1'. As a result, op amp 502 forces the reference voltage $V_{REF}$ across matching capacitor C1', while sensing the current required to do this. Scaling the current set by the size of transistor 506 by the ratio of the loop-filter damping capacitor C1 to the matching sense capacitor C1' would allow the effects of the leakage current in the damping capacitor C1 to be reduced or even canceled.

This approach allows PLL 208 of FIG. 2 to be implemented using a damping capacitor C1 having a relatively small gate oxide thickness (e.g., about 17 Angstroms) by cancelling the adverse effects of the resulting gate leakage current.

Sensing and Canceling Gate Leakage Current at the Transconductor Capacitor

The gate leakage current in the transconductor capacitor C3 of FIG. 3 is relatively difficult to sense and cancel, because of the wide range of voltages this capacitor can have with processing variations. One approach is to scale up the gain of the transconductor cell Gm, so that it is capable of providing the current to offset leakage currents. Another approach is to replace the analog transconductor integrator with a discrete time equivalent, which has the advantage of having a voltage output that is insensitive to gate leakage currents. Yet another approach is to wrap a discrete time feedback loop around the transconductor integrator to sense and cancel the input-referred offset voltage necessary to drive the gate leakage current out of the transconductor cell.

Figure 6:
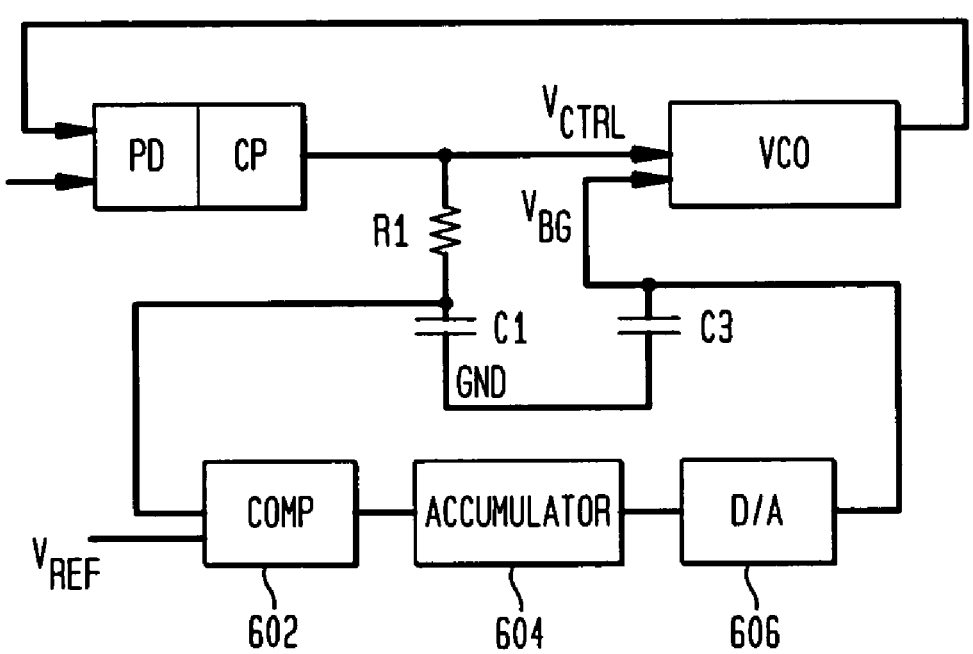
FIG. 6 shows a schematic diagram of a PLL, according to another embodiment of the present invention.

FIG. 6 shows a schematic diagram of a PLL 600, according to another embodiment of the present invention. PLL 600, which may be used for PLL 208 of FIG. 2, is an example of the approach in which the analog transconductor integrator is replaced with a discrete time equivalent. In particular, transconductor cell Gm of FIG. 3 is replaced by comparator 602, digital accumulator 604, and digital-to-analog (D/A) converter 606.

In particular, comparator 602 samples and compares the voltage across damping capacitor C1 to reference voltage $V_{REF}$ to generate a digital value, whose magnitude and sign depend on the difference between those two voltages. Accumulator 604 accumulates the digital values received from comparator 602 over time, and D/A converter 606 converts the resulting accumulated value into an analog output that gets applied to capacitor C3 to generate the analog VCO input voltage signal $V_{BG}$. In one implementation, D/A converter 606 functions as a voltage source generating an analog voltage signal. In another implementation, D/A converter 606 functions as a current source generating an analog current signal. When capacitor C3 is driven by a voltage source, rather than a current source, the effects of gate leakage current are moot.

In order for the digital path to act as an integrator, the rate at which comparator 602 samples the voltage on capacitor C1 could be very low (e.g., a frequency more than three orders of magnitude less than the 3 dB frequency of the closed-loop PLL) or the gain of the accumulator could be small or some appropriate combination of both relatively low sample rate and relatively small accumulator gain so that there is a low-pass filtering effect from the voltage on capacitor C1 to $V_{BG}$, with the corner frequency of this low-pass filter many (e.g., three or more orders of magnitude below the equivalent 3 dB frequency of the closed-loop PLL). Also, capacitor C3 should filter the step response of the D/A output, with a time constant significantly below that of the closed-loop PLL response. This would ensure that a change in the output of the D/A converter is not seen as a phase ramp/frequency step at the input to the data/phase detector, which could result in bit errors. By slowing down the rate at which the D/A output voltage into the VCO can change, the wide-band PLL loop can compensate for the changing voltage at the high-gain input to the VCO.

The particular type of comparator and where the accumulator derives its input from may vary from implementation to implementation, allowing for design-specific tradeoffs.

This approach allows PLL 600 to be implemented using a capacitor C3 having a relatively small gate oxide thickness (e.g., about 17 Angstroms) by cancelling the adverse effects of the resulting gate leakage current.

Figure 7:
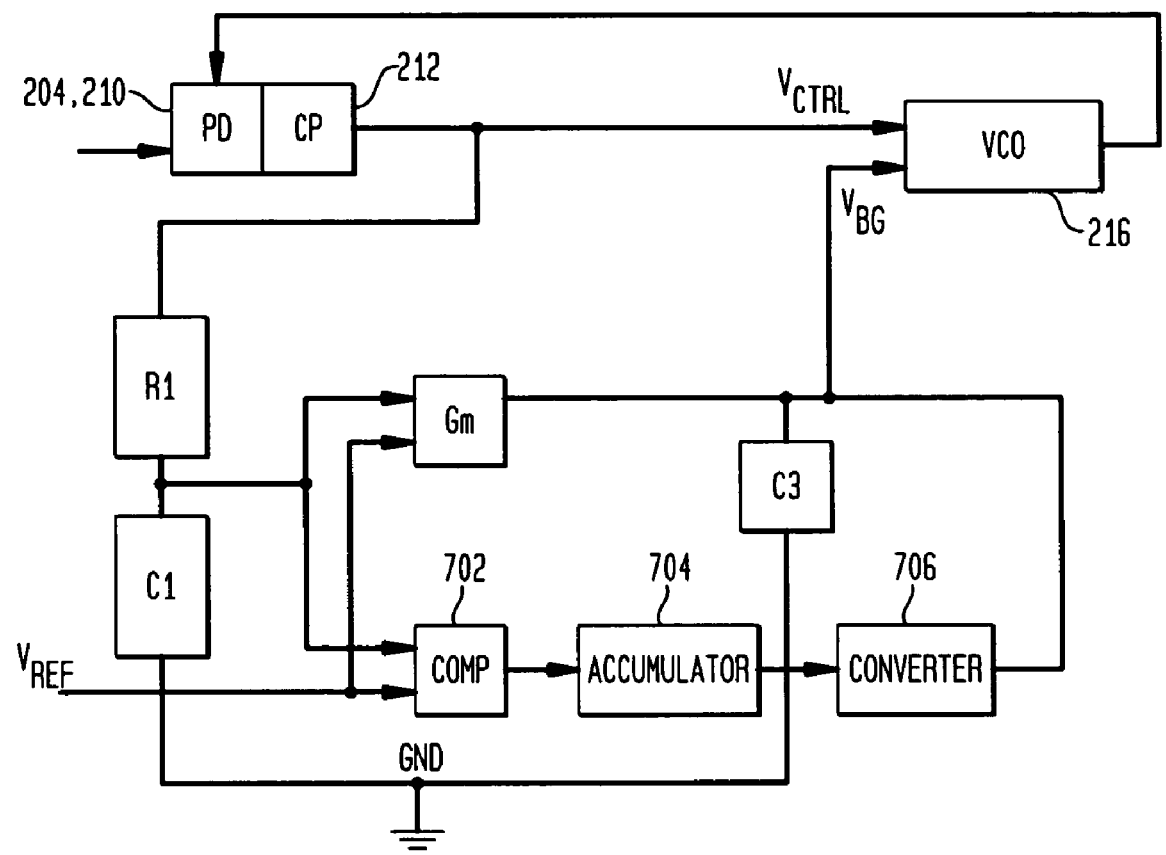
FIG. 7 shows a schematic diagram of a PLL, according to yet another embodiment of the present invention.

FIG. 7 shows a schematic diagram of a PLL 700, according to yet another embodiment of the present invention. PLL 700, which may be used for PLL 208 of FIG. 2, is an example of the approach in which a digital accumulator is implemented in parallel with an analog transconductor integrator. In this case, the continuous-time integrator provides the main performance, while the parallel digital accumulator is used to compensate for the gate leakage currents and any other DC leakage currents on capacitor C3. Note that, in this embodiment, the digital accumulator includes comparator 702, digital accumulator 704, and current source (Idac) 706, which converts the accumulated digital value from accumulator 704 into a current signal that is applied to capacitor C3.

According to this approach, in order for transconductor cell Gm to supply a dc current to compensate for gate leakage current in capacitor C3, a non-zero differential input is applied to the transconductor cell. By using a comparator to sense this differential input voltage and integrating the comparator output over a period of time long enough to make the loop stable, a digital word can be created. This drives Idac 706, which produces a current compensating for the gate leakage current in C3.

When the Idac output current changes, the high-gain input $V_{BG}$ to the VCO will change as the current difference between the Idac output and the gate leakage current is integrated onto the capacitor. The main PLL feedback loop will, via phase detector (PD) and charge pump (CP), adjust the voltage at the input to the transconductor cell, so that the output current of the transconductor cell changes by an amount equal to, but opposite in sign to, the original change in the output of the Idac.

Assuming the time constant of the digital integrator is at least two orders of magnitude slower than the time constant associated with the Gm stage and capacitor C3, the entire loop should remain stable.

There are second-order effects which might need to be addressed. One is the difference between the input-referred offset of the comparator and the input-referred offset of the transconductor cell itself. One solution is to use the same differential pair for both the transconductor cell and the comparator, guaranteeing that they both see almost exactly the same input-referred offset voltage.

Another difficulty is to create an Idac whose least significant bit (LSB) is on the order of 100 nanoamps. In this case, since the polarity of the gate leakage current is known, one can use the digital bits to adjust the bias current in the output stage of the transconductor cell to compensate for the gate leak currents. No separate D/C converter block is required.

Another difficulty arises from the fact that, because the new path is a digital loop, the output of the Idac will dither. While it might appear that this would cause a triangular wave to appear on the voltage across capacitor C3, this is not the case. In fact, the main PLL loop, whose bandwidth is much larger, adjusts the voltage on capacitor C1 instead. The voltage on capacitor C1 is adjusted to cause the current output from the transconductor cell to compensate for the current change from the Idac. Thus, the voltage across capacitor C3 will charge slightly as the output of the Idac changes, and then settle back as the value of the voltage across capacitor C1 changes to accommodate. This ripple can be kept arbitrarily small by keeping capacitor C3 large, the LSB step size of the Idac small, or some combination of both.

In the event this ripple becomes unacceptable, because gate leakage currents are primarily a DC term, it is possible to turn the adaptation loop off after some initial period. This leaves the main transconductor cell to accommodate the residual error, and any errors created by a change in temperature from when the adaptation loop was turned off. The change in gate leakage currents with temperature needs to be small enough to be well within the linear range of the transconductor cell.

This approach allows PLL 700 to be implemented using a capacitor C3 having a relatively small gate oxide thickness (e.g., about 17 Angstroms) by cancelling the adverse effects of the resulting gate leakage current.

Although the technique for sensing and canceling the effects of gate leakage current in damping capacitor C1 shown in FIG. 5 and the techniques for sensing and canceling the effects of gate leakage current in transconductor capacitor C3 shown in FIGS. 6 and 7 can be implemented separately, in a preferred embodiment, techniques for each capacitor are combined to enable both capacitors to be implemented with relatively small gate oxide thicknesses.

Although the present invention has been described in the context of phase-locked loops, the present invention can also be implemented in the context of other types of signal synthesizers, such as delay-locked loops (DLLs).

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

I claim:

1. A signal synthesizer comprising a loop filter connected between a charge pump and an oscillator of the signal synthesizer to accumulate charge from the charge pump and generate at least a first control signal for the oscillator, the loop filter comprising:
   a damping capacitor connected at a first node to a resistor connected to the oscillator to generate the first control signal for the oscillator;
   a matching capacitor;
   sensing-and-canceling circuitry connected to the damping capacitor and to the matching capacitor and adapted to (1) drive a voltage across the matching capacitor to match a first reference voltage applied to an input of the sensing-and-canceling circuitry and (2) generate, based on a first current associated with driving the voltage across the matching capacitor, a second current applied to the damping capacitor to compensate for leakage current in the damping capacitor;
   transconductor circuitry connected to the first node; and
   a transconductor capacitor connected to the transconductor circuitry and the oscillator to generate a second control signal for the oscillator.

2. The invention of claim 1, wherein:
   the signal synthesizer is a PLL;
   a first side of the resistor is connected to the damping capacitor at the first node;
   a second side of the resistor is connected to both the charge pump and the oscillator; and
   the first control signal is generated based on a second voltage at the second side of the resistor.

3. The invention of claim 1, wherein the oscillator is adapted to use the first control signal for steady-state control of the synthesizer.

4. The invention of claim 1, wherein the sensing-and-canceling circuitry comprises:
   an operational amplifier (op amp) adapted to generate a voltage difference signal based on a difference between the voltage across the matching capacitor and the first reference voltage;
   a first transistor connected (1) to receive the voltage difference signal from the op amp at a gate of the first transistor and (2) to apply a first transistor output signal to the matching capacitor; and
   a second transistor connected (1) to receive the voltage difference signal from the op amp at a gate of the second transistor and (2) to apply a second transistor output signal to the damping capacitor.

5. The invention of claim 1, wherein gate oxide thickness of the damping capacitor is substantially less than about 50 Angstroms.

6. The invention of claim 5, wherein the gate oxide thickness of the damping capacitor is about 17 Angstroms or less.

7. The invention of claim 1, wherein the sensing-and-canceling circuitry is adapted to generate the second current as a scaled version of the first current based on a capacitance ratio between the damping capacitor and the matching capacitor.

8. The invention of claim 1, wherein gate oxide thickness of the transconductor capacitor is substantially less than about 50 Angstroms.

9. The invention of claim 8, wherein the gate oxide thickness of the transconductor capacitor is about 17 Angstroms or less.

10. The invention of claim 1, wherein the oscillator is adapted to use the second control signal to set a center frequency for the oscillator.

11. The invention of claim 1, wherein the transconductor circuitry comprises an analog transconductor (gm) cell connected between (1) the first node and (2) the transconductor capacitor, wherein the gm cell is adapted to generate a first gm output signal based on a difference between the voltage at the first node and a second reference voltage applied to an input of the gm cell, wherein the first gm output signal is applied to the transconductor capacitor.

12. The invention of claim 11, wherein the second reference voltage is equal to the first reference voltage.

13. The invention of claim 11, wherein the transconductor circuitry comprises a digital gm path adapted to (1) digitally accumulate differences between the voltage at the first node and the second reference voltage and (2) generate a second gm output signal based on the accumulated differences, wherein the second gm output signal is also applied to the transconductor capacitor.

14. The invention of claim 13, wherein the digital gm path comprises:
   a comparator adapted to generate digital differences between the voltage at the first node and the second reference voltage;
   an accumulator adapted to accumulate the digital differences; and
   a converter adapted to convert the accumulated digital differences from the accumulator into the second gm output signal.

15. The invention of claim 1, wherein the transconductor circuitry comprises a digital gm path adapted to (1) digitally accumulate differences between the voltage at the first node and the second reference voltage and (2) generate a gm output signal based on the accumulated differences, wherein the gm output signal is applied to the transconductor capacitor.

16. The invention of claim 15, wherein the digital gm path comprises:
   a comparator adapted to generate digital differences between the voltage at the first node and the second reference voltage;
   an accumulator adapted to accumulate the digital differences; and
   a converter adapted to convert the accumulated digital differences from the accumulator into the gm output signal.

17. The invention of claim 15, wherein the converter is a voltage source adapted to generate the gm output signal as a voltage signal.

18. The invention of claim 15, wherein the converter is a current source adapted to generate the gm output signal as a current signal.

19. A signal synthesizer comprising a loop filter connected between a charge pump and an oscillator of the signal synthesizer to accumulate charge from the charge pump and generate at least a first control signal for the oscillator, the loop filter comprising:
   a resistor;
   a damping capacitor connected at a first node to the resistor;
   a transconductor capacitor connected to generate the first control signal for the oscillator; and
   a digital gm path connected between the first node and the transconductor capacitor and adapted to (1) digitally accumulate differences between a reference voltage and a voltage at the first node and (2) generate a first gm output signal based on the accumulated differences, wherein the first gm output signal is applied to the transconductor capacitor.

20. The invention of claim 19, wherein the signal synthesizer is a PLL.

21. The invention of claim 19, wherein gate oxide thickness of the transconductor capacitor is substantially less than about 50 Angstroms.

22. The invention of claim 21, wherein the gate oxide thickness of the transconductor capacitor is about 17 Angstroms or less.

23. The invention of claim 19, wherein the oscillator is adapted to use the first control signal to set a center frequency for the oscillator.

24. The invention of claim 19, wherein the loop filter further comprises an analog transconductor (gm) cell connected between (1) the first node and (2) the transconductor capacitor, wherein the gm cell is adapted to generate a second gm output signal based on a difference between the voltage at the first node and the reference voltage, wherein the second gm output signal is also applied to the transconductor capacitor.

25. The invention of claim 19, wherein the digital gm path comprises:
   a comparator adapted to generate digital differences between the voltage at the first node and the reference voltage;
   an accumulator adapted to accumulate the digital differences; and
   a converter adapted to convert the accumulated digital differences from the accumulator into the second gm output signal.

26. The invention of claim 25, wherein the converter is a voltage source adapted to generate the second gm output signal as a voltage signal.

27. The invention of claim 25, wherein the converter is a current source adapted to generate the second gm output signal as a current signal.

28. A signal synthesizer comprising a loop filter connected between a charge pump and an oscillator of the signal synthesizer to accumulate charge from the charge pump and generate at least a first control signal for the oscillator, the loop filter comprising:
   a resistor connected, on a first side, to the charge pump and the oscillator and, on a second side, to a first node;
   a transconductor capacitor connected to the oscillator to contribute to the generation of the first control signal for the oscillator; and
   a digital gm path connected between the first node and the transconductor capacitor and adapted to (1) digitally accumulate differences between (i) a voltage at the first node in the loop filter and (ii) a first reference voltage and (2) generate a first gm output signal based on the accumulated differences, wherein the first gm output signal is applied to the transconductor capacitor to compensate for leakage current in the transconductor capacitor.

29. The invention of claim 28, wherein the loop filter further comprises:
   a damping capacitor connected to the resistor to generate a second control signal for the oscillator; and
   sensing-and-canceling circuitry comprising a matching capacitor, wherein the sensing-and-canceling circuitry is adapted to (1) drive a voltage across the matching capacitor to match a first reference voltage and (2) generate, based on a first current associated with driving the voltage across the matching capacitor, a second current applied to the damping capacitor to compensate for leakage current in the damping capacitor.

30. The invention of claim 28, wherein the loop filter further comprises an analog transconductor (gm) cell connected between (1) the first node and (2) the transconductor capacitor, wherein the gm cell is adapted to generate a second gm output signal based on a difference between the voltage at the first node and the first reference voltage, wherein the second gm output signal is also applied to the transconductor capacitor.

31. The invention of claim 28, wherein gate oxide thickness of the capacitor is substantially less than about 50 Angstroms.

32. The invention of claim 31, wherein the gate oxide thickness of the capacitor is about 17 Angstroms or less.

* * * * *